United States Patent
Stark

(10) Patent No.: US 12,074,409 B2
(45) Date of Patent: Aug. 27, 2024

(54) LASER DIODE DRIVE METHOD AND ARRANGEMENT

(71) Applicant: Prysm Systems, Inc., Milpitas, CA (US)

(72) Inventor: Robert N. Stark, Saratoga, CA (US)

(73) Assignee: Prysm Systems, Inc., Milpitas, CA (US)

(*) Notice: Subject to any disclaimer, the term of this patent is extended or adjusted under 35 U.S.C. 154(b) by 762 days.

(21) Appl. No.: 17/194,763

(22) Filed: Mar. 8, 2021

(65) Prior Publication Data

US 2021/0210927 A1 Jul. 8, 2021

Related U.S. Application Data

(63) Continuation of application No. 16/528,283, filed on Jul. 31, 2019, now Pat. No. 10,944,239.

(60) Provisional application No. 62/714,027, filed on Aug. 2, 2018.

(51) Int. Cl.
  *H01S 5/042* (2006.01)
  *G09G 3/32* (2016.01)
  *H01S 5/026* (2006.01)

(52) U.S. Cl.
  CPC ............ *H01S 5/0428* (2013.01); *G09G 3/32* (2013.01); *H01S 5/0261* (2013.01)

(58) Field of Classification Search
  CPC .. H01S 5/0428; H01S 5/0261; H01S 5/06216; H01S 5/06226; H01S 5/042; G09G 3/32; G09G 3/02–025
  See application file for complete search history.

(56) References Cited

U.S. PATENT DOCUMENTS

| 4,481,465 A | 11/1984 | Fredericks et al. |
| 2004/0258115 A1 | 12/2004 | Murata et al. |

FOREIGN PATENT DOCUMENTS

| JP | 2005032808 A | * | 2/2005 |
| JP | 2006178364 A | * | 7/2006 |

* cited by examiner

*Primary Examiner* — Xinning(Tom) Niu
(74) *Attorney, Agent, or Firm* — PATTERSON + SHERIDAN, LLP; Steven H. VerSteeg

(57) ABSTRACT

A method and apparatus to drive a laser diode are disclosed comprising increasing a bias current to the laser diode to a threshold level, wherein the threshold level is below an actuation level of the laser diode and wherein a resistor is placed in parallel to the laser diode, charging a capacitance to a precharge capacitance of a circuit including the laser diode, wherein the precharge capacitance is below a capacitance actuation level of the laser diode; and actuating the laser diode.

18 Claims, 13 Drawing Sheets

LASER DIODE DRIVE METHOD AND ARRANGEMENT

CROSS-REFERENCE TO RELATED APPLICATIONS

This application is a continuation of U.S. patent application Ser. No. 16/528,283, filed Jul. 31, 2019, which application claims benefit of U.S. Provisional Patent Application Ser. No. 62/714,027, filed Aug. 2, 2018, each of which is herein incorporated by reference.

BACKGROUND OF THE DISCLOSURE

Field of the Disclosure

Embodiments of the present disclosure generally relate to laser diodes. More specifically, embodiments of the present disclosure relate to laser diode drive methods and arrangements.

Description of the Related Art

A Laser Phosphor Display (LPD) generates video images by illuminating pixels using multiple focused laser beams that are scanned across the screen. Each pixel embedded in the display screen contains phosphor material that radiates light proportional to the laser beams power and time over the pixel. The brightness of each pixel can therefore be controlled by a combination of the laser diodes peak drive current and pulse width duration. A high quality LPD display needs to achieve high resolution (pixels are close together) and a wide optical dynamic range in brightness levels. When multiple lasers are used, it is also critical that the drive circuits be low cost and simple in construction.

Achieving perfect blacks is very critical to a Seamless LPD display because of the overlap of each light engines image region. The black levels add in the overlap regions resulting in a checkerboard visual affect that the viewer would see unless the blacks are truly black. The present drive method requires a trade-off between perfect blacks and pulse performance due to the simplicity and low cost of the architecture and the non-linear nature of a laser diode.

The conventional methods and apparatus have several limitations. The first limitation of the present design is that the bandwidth of the driver reduces as the peak current level is reduced. The lower bandwidth results in slower rise and fall times and ultimately makes it very difficult to achieve optical power control in what is called 'the low grey region' of the display curve. One method to improve the linearity in the 'low grey region' involves raising the laser diode dc bias current. Unfortunately, since the LD operates like an LED at low currents, the screen phosphors still receive sufficient illumination resulting in black levels looking grey.

A second limitation of the existing drive method is that because the pixels are close together, the peak level of the driver pulse may be affected by the previous pulse or pulses. This makes it more difficult to control the linearity of the image and can even result in a pixel failing to illuminate if it was preceded by a black region of sufficient duration. Both limitations can be minimized using more advanced processing in software and FPGA hardware, but it is very desirable to eliminate this interaction.

The third limitation arises from the non-linear nature of a laser diode. This presents a non-linear load for the driver circuit that makes it hard to optimize over the entire operating range.

A fourth limitation is the calibration required to control the previous limitations. Optical factory equipment must be employed to measure black levels and balance the driver currents since all laser diodes have different output characteristics vs current.

There is a need to provide a method to drive a laser diode that is superior to the conventional driving methods.

There is a need to provide a method wherein the bandwidth of the driver does not reduce as the peak current level is reduced.

There is further need to provide a method wherein a peak level of the driver pulse is not affected by a previous pulse or pulses.

There is a further need to provide a method that loads for a driver circuit are optimized over an entire operating range.

SUMMARY OF THE DISCLOSURE

In one embodiment, a method to drive a laser diode is disclosed comprising increasing a bias current to the laser diode to a threshold level, wherein the threshold level is below an actuation level of the laser diode and wherein a resistor is placed in parallel to the laser diode, charging a capacitance to a precharge capacitance of a circuit including the laser diode, wherein the precharge capacitance is below a capacitance actuation level of the laser diode, and actuating the laser diode.

In another embodiment, a method to drive a laser diode is disclosed comprising increasing a bias current to the laser diode in a series of pulses to a threshold level, wherein the threshold level is below an actuation level of the laser diode and wherein a resistor is placed in parallel to the laser diode and wherein the series of pulses are greater in frequency than a laser diode current discharge rate, charging a capacitance to a precharge capacitance of a circuit including the laser diode, wherein the precharge capacitance is below a capacitance actuation level of the laser diode and actuating the laser diode.

In another embodiment, an arrangement for providing a current to an apparatus, is disclosed comprising a diode, a resistor placed in parallel to the laser diode, at least two transistors, wherein each transistor has a collector, an emitter and a base, and each collector is connected to the laser diode, at least one operational amplifier connected to each base of the at least two transistors, a direct current power supply connected to the at least one operational amplifier and at least one direct current power supply connected to each of the emitters of the at least two transistors.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the FIGS. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

In one embodiment, a driver method for a laser diode is disclosed. The driver method provides a way to achieve the full potential of LDP technology by allowing laser diode 'off' current to reach zero while still maintaining high bandwidth pulse control of the laser diodes peak current waveform. The method also reduces the 'history effect' by preventing the pulse current from one pixel from affecting other pixels. The driver method also simplifies calibration of the product by eliminating optical factory equipment to fine tune the bias current for each laser channel (typically 20 channels) compared to conventional methods. In embodiments, a board tester is used to set all channels to a pre-determined bias value.

Background on Laser Diode Driving

Figure 1:
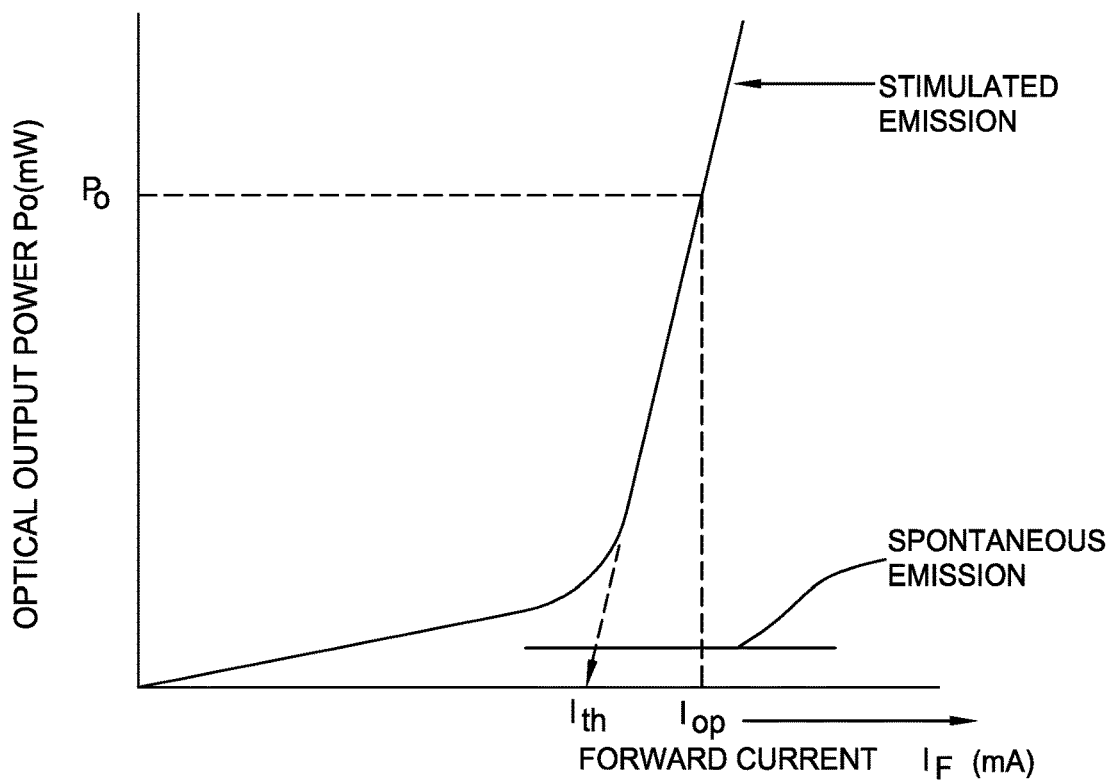
FIG. 1 is a curve of an optical output power vs forward current for a laser diode.

FIG. 1 shows a laser diode curve of output power in mw vs current in ma for a conventional application for driving a laser diode. There are two distinct regions of operation, below threshold (LED region) and above threshold (laser region). In all laser diode applications, the goal is to operate the device above threshold in the lasing region where optical output rises linearly with increasing current.

Figure 2:
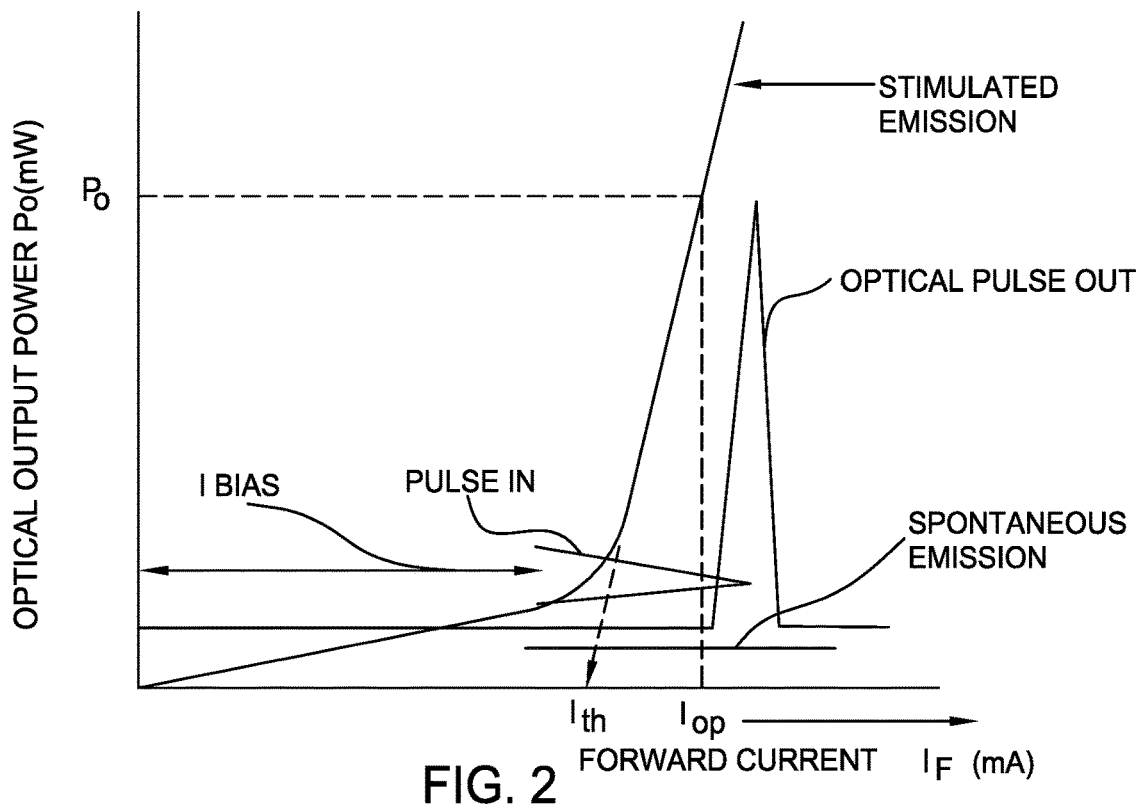
FIG. 2 is typical modulation for a curve of an optical output power vs forward current for a laser diode.

In typical pulsed applications, a small residual 'OFF' LED output level may be tolerated so circuits are not required to dynamically reduce the laser diode current to zero. Instead, in conventional applications, most laser diode arrangements operate with a dc bias 'Off' level shown in FIG. 2 either just below the knee or just above the knee to keep the driver in a linear operating range and support a fast entry into the lasing region.

In an LDP display application, however, it is desirable to set the 'OFF' dc level as close to zero as possible to minimize any LED optical output. In an LDP display, systems are operated in the lasing region above threshold and must achieve a wide brightness range from several hundred nits down to a fraction of a nit. The bright end of the range is achieved by generating fast rise time 1000 mw optical pulses that approach a 50% on to off duty cycle to fully illuminate each phosphor pixel region. The low end of the range is achieved by generating current pulses that are very narrow and with amplitudes that exceed the laser threshold. The low end of the dynamic range, described above, requires that the 'off' or black level is less than 1 mnit, which can only be achieved with less than 1 ma of laser diode current. Since every laser diode will output a different optical output level for the same drive current, the circuits must be very precise or require careful calibration to achieve good background uniformity across the screen.

Conventional Methods to Control Laser Diode Current

Figure 3:
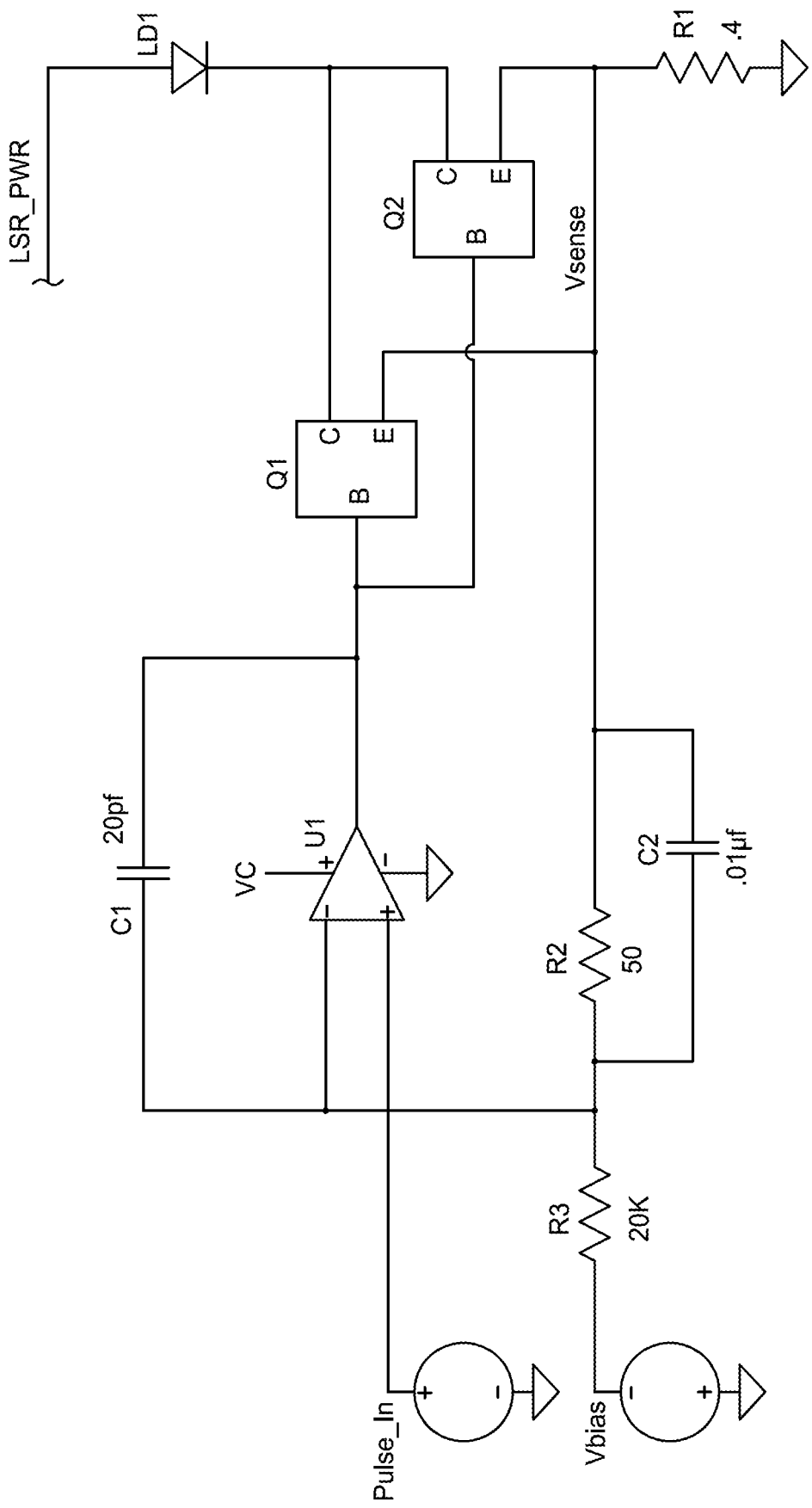
FIG. 3 is an conventional arrangement for controlling laser diode current.

FIG. 3 illustrates a typical drive circuit for a conventional way of controlling the laser diode current through the laser diode identified as LD1. The circuit consists of op amp U1 driving the base of two high speed transistors Q1 and Q2 wired in parallel. Two transistors are used to provide up to one amp peak current. The anode of LD1 is connected to LSR_PWR that, in one embodiment, is set to +8 volts. The cathode of LD1 is connected to the collectors of Q1 and Q2. The two emitters are connected to current sense resistor R1 that converts the current flowing through the transistors to a voltage labeled Vsense that is connected through feedback resistor R2 to the negative input of U1. This completes a feedback loop that converts the Pulse_In voltage into a current pulse that flows from the LSR_PWR voltage source through the laser diode LD1 and into Q1 and Q2. The input signal labeled Pulse_In is typically the output from an analog switch whose input is an adjustable voltage source. When the switch is turned on, the voltage source is connected to Pulse_In and results in a laser diode current pulse until the switch is closed. A second input to the circuit is an adjustable voltage source labeled Vbias that is set to correct for any offset errors in the amplifier U1 and minimize the LD current when Pulse_In is off. Note that Pulse_In typically consists of voltage pulses with rise and fall times less than 5 ns and pulse on times ranging from 5 to 100 ns and can be considered near ideal.

There are several limitations of this circuit that affect the performance when attempting to minimize laser diode off current and maximize pulse performance. These limitations are primarily due to the circuits low cost and simple architecture. Laser diodes are very sensitive to momentary negative voltages and over currents so this design only uses positive supplies to provide reliable operation. This circuit uses an open collector topology and controls the laser current by sinking current from the laser into the collectors under closed loop control. The circuit can therefore increase the laser current very quickly by driving more base current into the transistors, but relies on the laser impedance to reduce the current. Also, when the laser is positioned farther away from the driver, there will be additional capacitance from the collector to ground and from the collector to LSR_PWR that will slow down the turn off.

Figure 4:
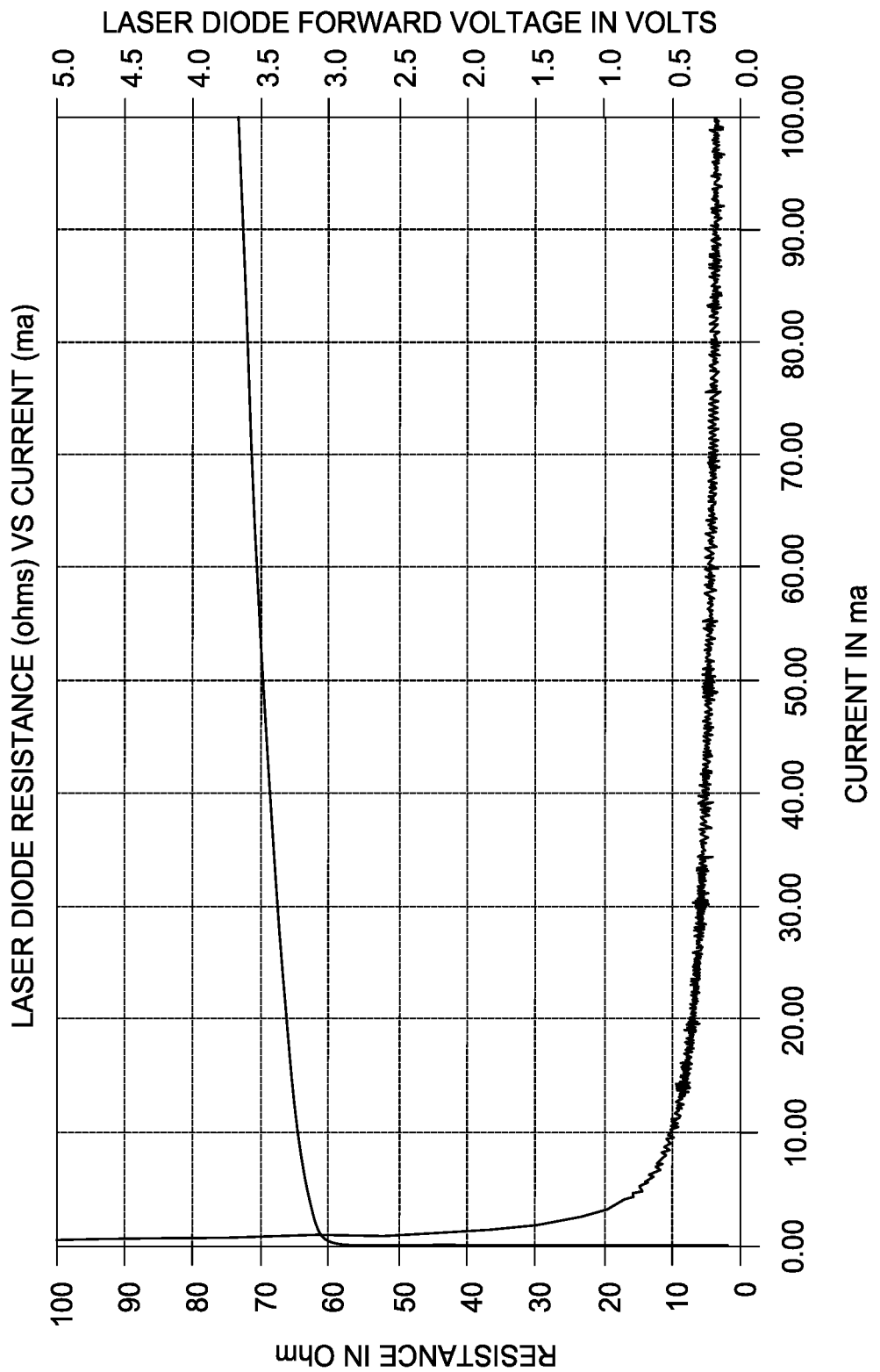
FIG. 4 is graph of laser diode resistance vs current.

Turn off is complicated by the fact that a laser diodes voltage drop and resistance varies non-linearly with current as shown in FIG. 4. As the current increases above threshold (about 120 ma), the resistance approaches a few ohms, but at 1 ma or less, the resistance can easily reach 10K or higher. The laser diode also has a forward voltage drop of several volts.

When high peak pulse currents are applied to the laser diode, the turn off times are very fast since the laser's low resistance provides a fast discharge path. When this non-linear device is driven with the circuit of FIG. 3, the pulse response will begin to degrade as we lower the bias or 'OFF' current close to 0 ma. The increase in laser diode resistance with lower current results in a slower decay of laser diode current. This makes the circuit sensitive to increased capacitance which limits locating the laser diode away from the driver.

Figure 5:
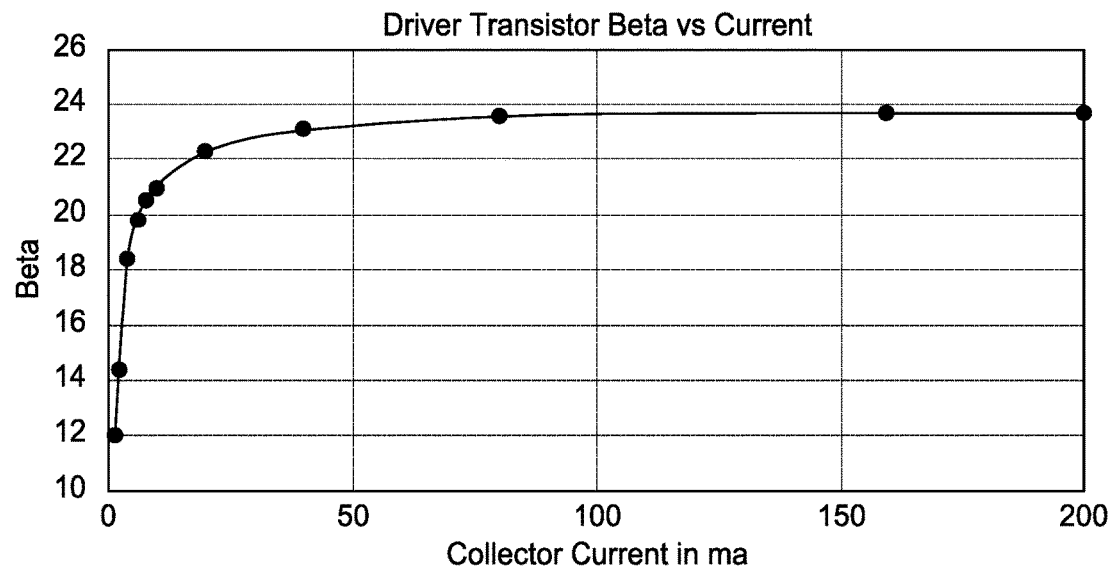
FIG. 5 is a graph of driver transistor beta vs collector current.

A second limitation of this circuit is due to the non-ideal nature of the transistors Q1 and Q2. These transistors are chosen for their high frequency and high current drive characteristics and consequently their gain or beta drops at lower currents. Referring to FIG. 5, a plot of transistor Beta=IC/IB vs current for the typical parts used in the existing driver is shown. As the current falls from about 15 ma to 0.8 ma (first point), it is seen that the combined transistor gain drops by about 50%. Since the circuit uses closed loop control to precisely control the current level, the close loop control results in a reduction in driver bandwidth as the current is reduced.

Figure 6:
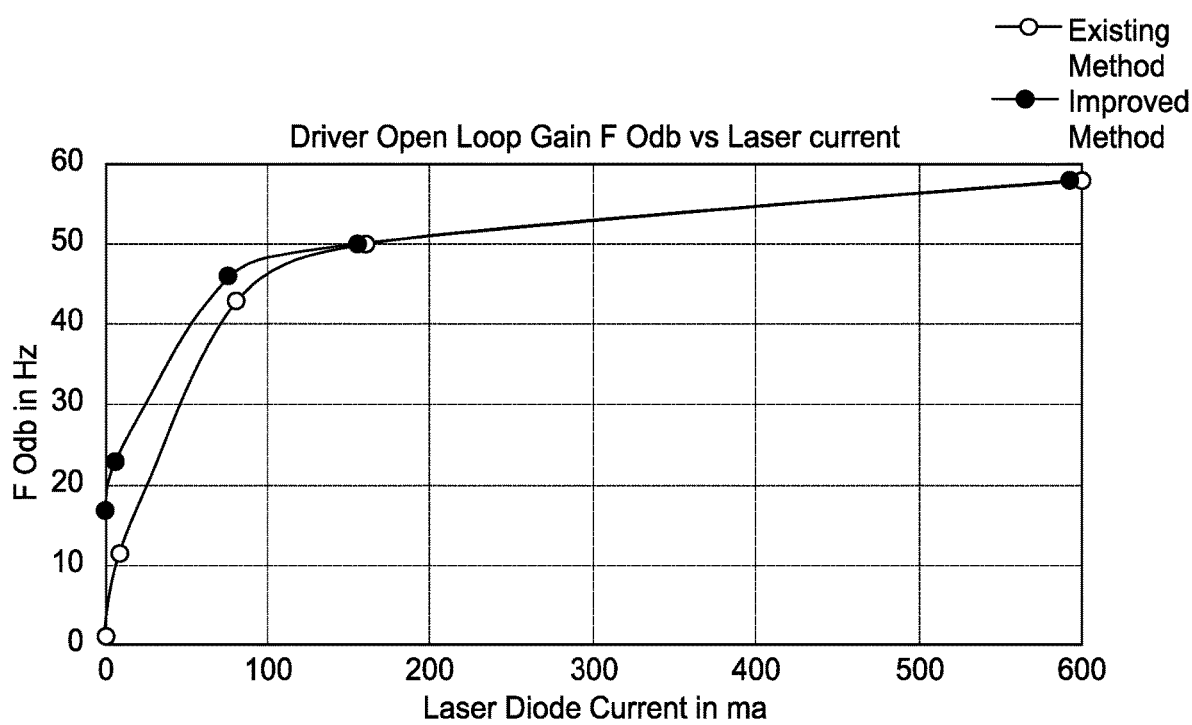
FIG. 6 a graph of drive open loop gain vs laser current.

One way to measure the limitations of the conventional method is to plot the open loop gain in the feedback loop vs dc bias current. From control theory, the bandwidth of the driver is proportional to the frequency in Hz where the open loop gain equals unity. This is plotted in FIG. 6 for the existing and new driver method. As seen in the figures, the open loop gain of both methods is the same for laser currents above 150 ma, but the existing method drops down to 1 Mhz at 1 ma. The new method raises this to 17 Mhz which is sufficient to produce very good control of the laser drive currents. A second way to show the limitations of the existing method and improvements in the new drive method is to measure and compare the optical pulse response.

Figure 7:
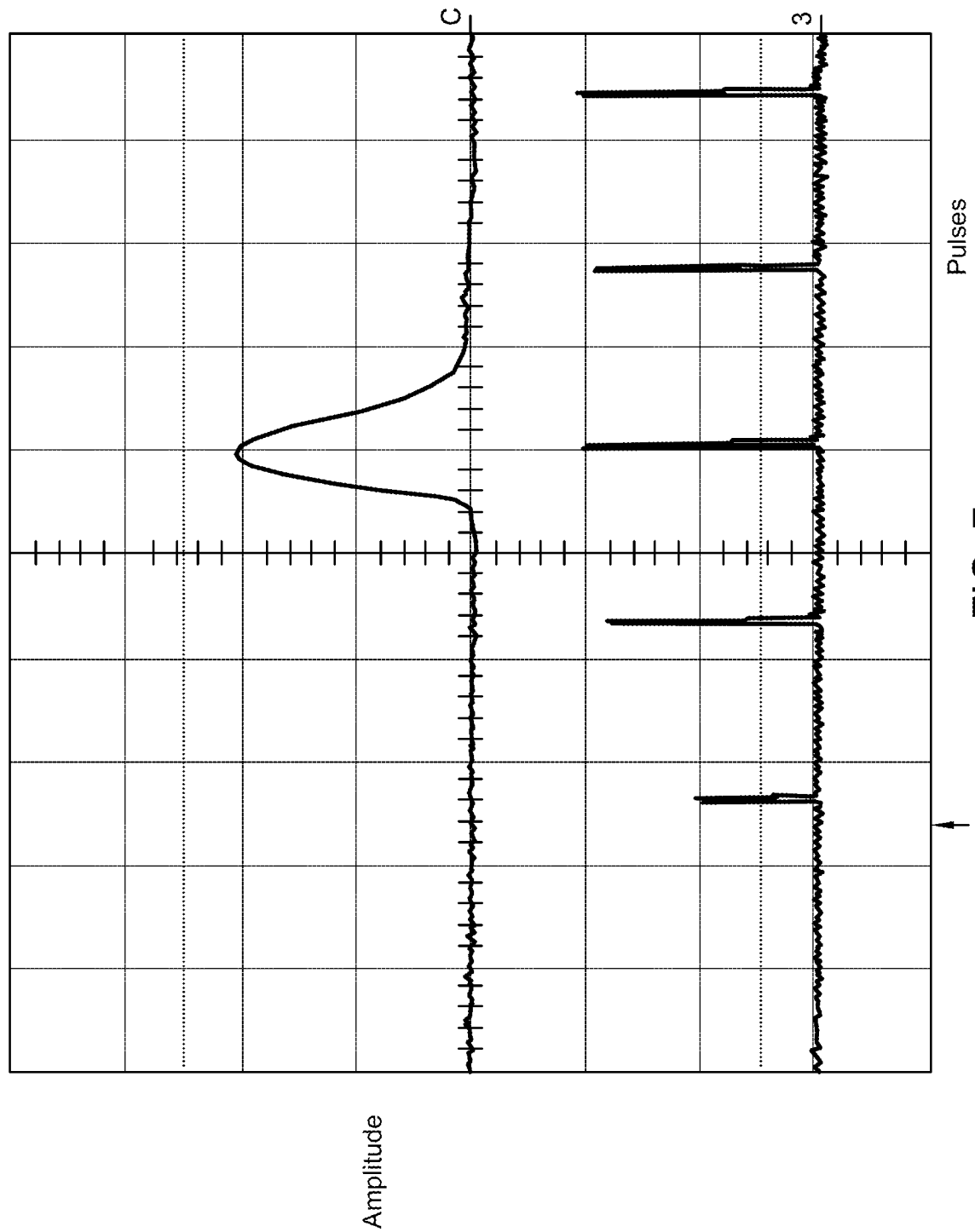
FIG. 7 is a graph of a conventional driver method with no bias resistor for a laser diode.
Figure 8:
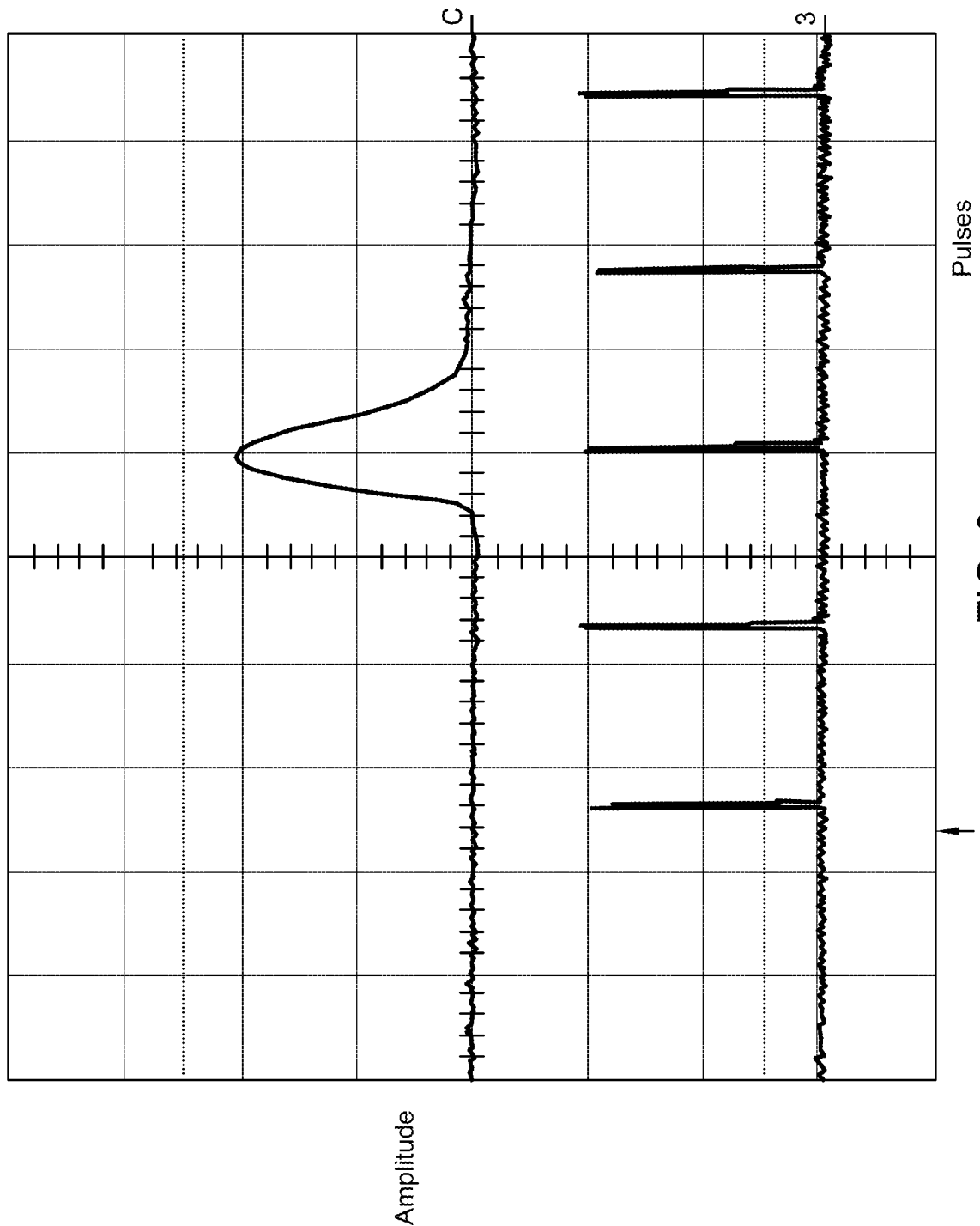
FIG. 8 is a graph of an improved driver method in one embodiment of the disclosure.
Figure 9:
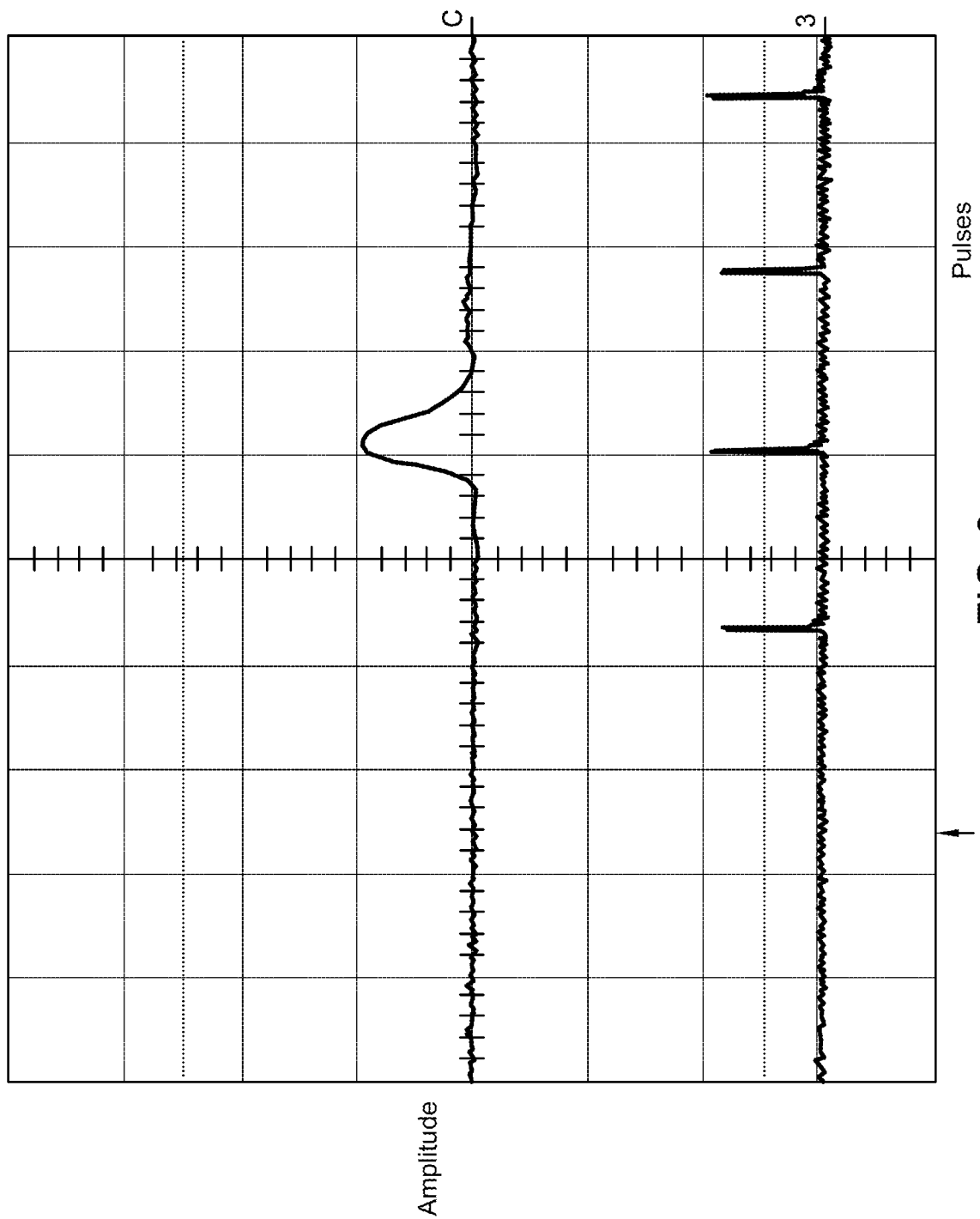
FIG. 9 is a graph of a conventional driver method with no bias resistor for a laser diode.
Figure 10:
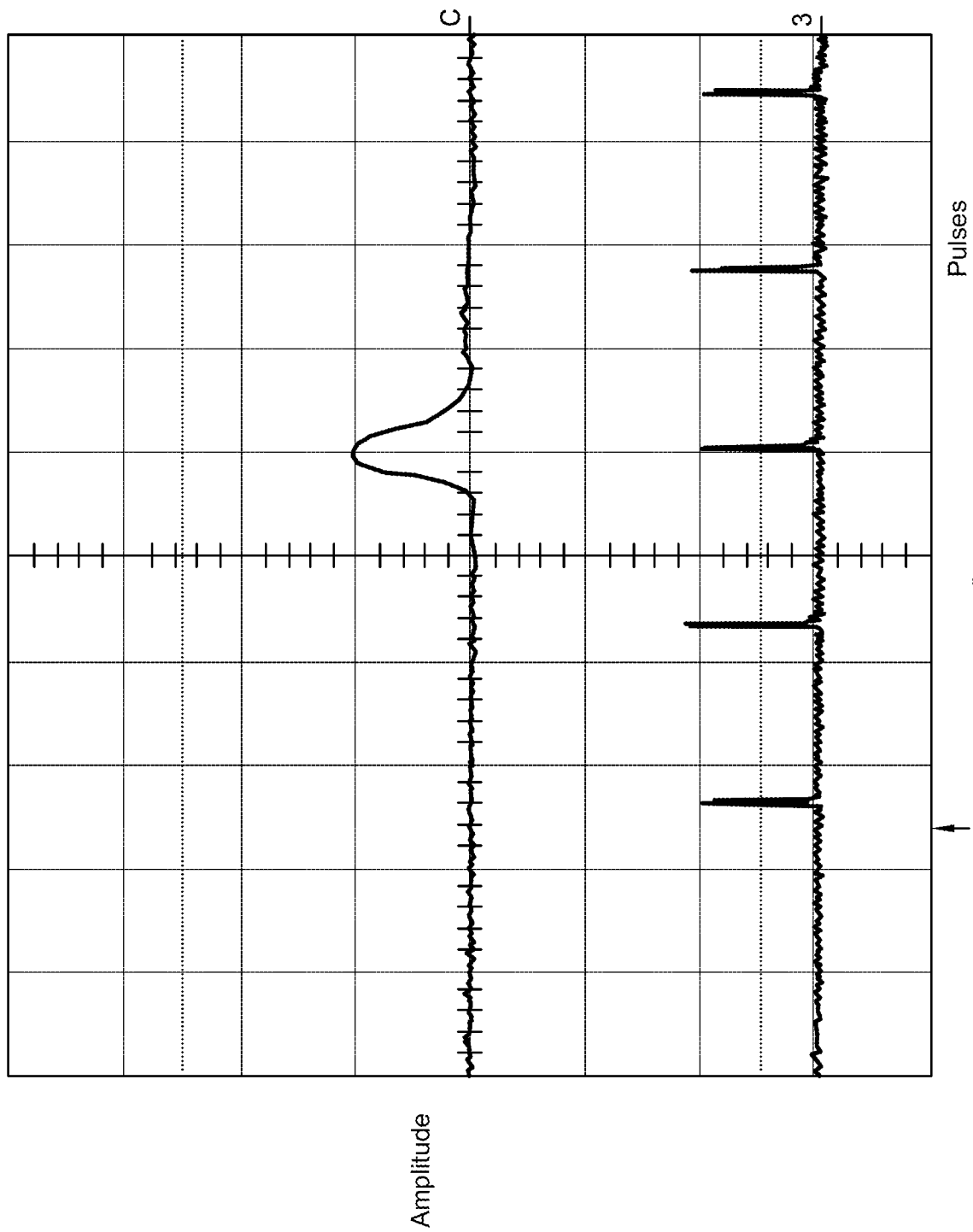
FIG. 10 is a graph of a conventional driver method with no bias resistor for a laser diode.

FIGS. 7, 8, 9 and 10 show the improvement of the described embodiments over conventional drive methods when operating in the most difficult region of narrow pulse widths and low amplitude pulses. The optical pulse response of the laser diode is measured by focusing the laser's output onto a high speed optical detector. For each of these FIGS., a burst of 5 identical pulses is generated and the pulse width is adjusted for identical steady state peak detector outputs. FIGS. 7 and 8 compare the existing (conventional) and new method and apparatus for 100 mv peak pulses. As seen in FIGS. 7 and 8, the first pulse amplitude in the burst is about 50% lower than the following pulses for the existing method. FIG. 8 shows that all 5 pulses are close to the same amplitude for the aspect described. A second observation is that the pulse width for the conventional method is 9.7 ns and has been reduced to 9.2 ns for the new aspects described. Both improvements are consistent with the bandwidth increase shown in FIG. 6. FIGS. 9 and 10 compare the existing (conventional) and new method for 50 mv peak pulses. In this case, the conventional method fails to generate the first pulse but, unlike in in the conventional diagram, all five (5) pulses are present for the new method. Note both methods will result in all five pulses reaching the same amplitude as the pulse width is increased and the peak level increases.

Figure 11:
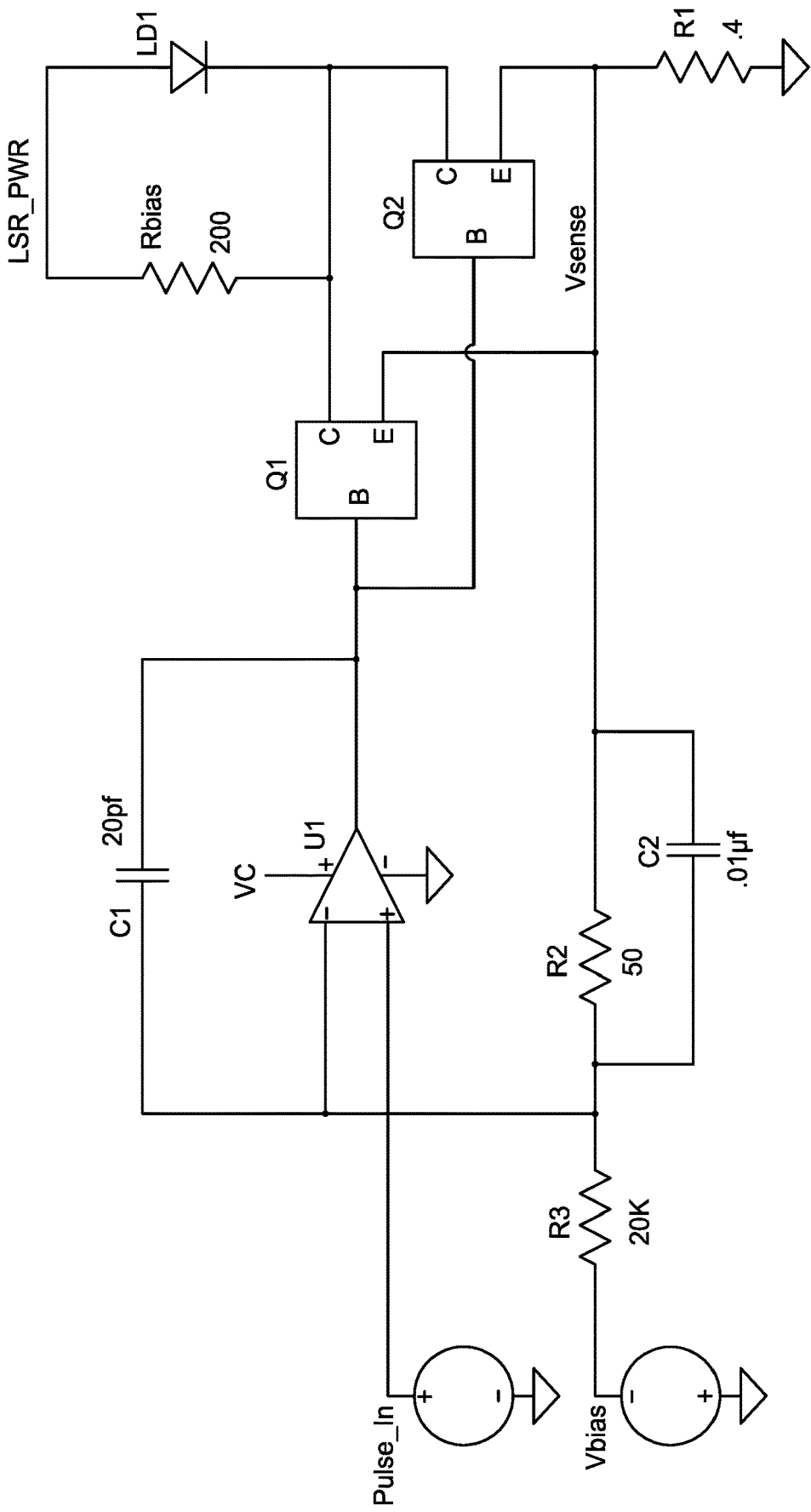
FIG. 11 is a graph of an arrangement for driving a laser diode current.

FIG. 11 illustrates one aspect of the disclosure of a drive method consisting of the addition of a single 200 ohm resistor placed in parallel with the laser diode. This resistor is called a 'Rbias' resistor. The Rbias resistor works in conjunction with Vbias and the laser diode non-linear transfer curve to provide a substantial improvement and cost-effective method to control the pulsed laser diode current. The curves of FIG. 4 show that the voltage drop across the laser diode has a sharp knee close to 3V that occurs at a low current level. We also know that below about 15 ma, the gain of transistors Q1 and Q2 will start to reduce contributing to a loss of open loop gain. Adding the proper resistor value in parallel with the laser diode in combination with setting the DC bias current through the resistor will allow the driver to operate at a minimum current and simultaneously allow the laser diode current to approach zero. In the case of driving a laser diode, setting the bias current to 15 ma will yield a 3 V drop across Rbias and result in a laser diode current of less than 0.1 ma. It is very desirable to set this voltage to match the laser diode forward threshold value since this minimizes the voltage swing from 'OFF' to 'ON' required to drive the laser resulting in faster optical rise and fall times.

Figure 12:
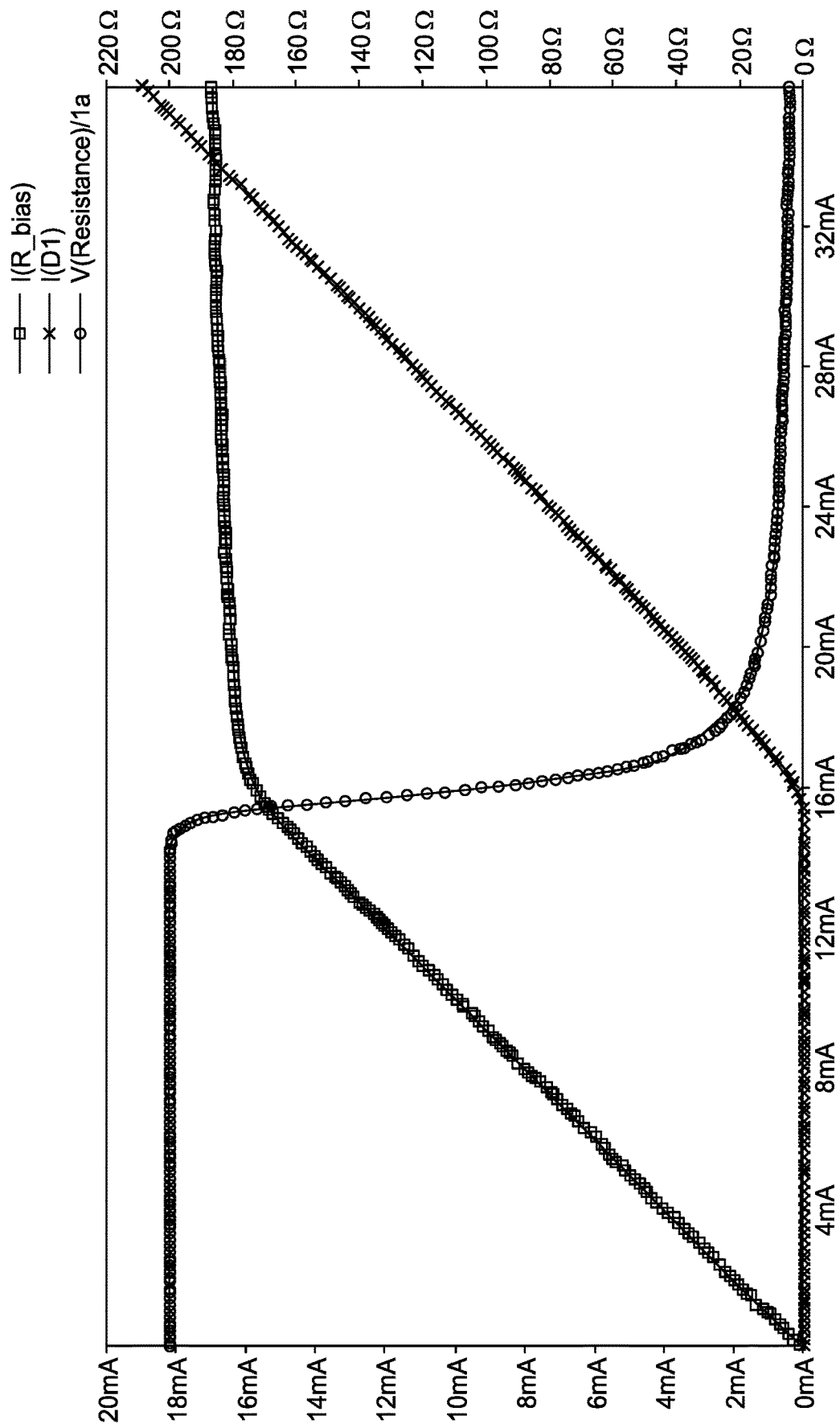
FIG. 12 is a graph of driver load resistance, Rbias and current vs driver current.

The above is further shown in FIG. 12. In this plot, the driver current swept from 0 to 36 ma on the horizontal axis and the current is plotted through the bias resistor, the current through the laser diode, and the combined parallel resistance of the bias resistor and the laser diode. This plot shows the bias current may be increased in the driver up to 15 ma and still result in the laser diode current remaining at zero. As the driver current is increased, the laser diode resistance drops resulting in most of the driver current flowing into the laser diode. This becomes even more effective as the laser diode is driven with higher currents. As expected, the combined driver load resistance=200 ohms at zero current and then transactions to several ohms as the current is increased.

The 200 Ohm resistor plays a significant role in reducing the effects of capacitance between the collectors and ground and also between the collectors and the LSR_PWR source. When the driver current is switched off the current decay is dominated by the RC time constant now controlled by the resistor at lower currents. This results in a significant improvement in preventing one pulse from affecting the next pulse as the time between pulses becomes short.

Lastly, the introduction of Rbias provides a method to calibrate the 'OFF' optical output level. Instead of relying on optical measuring equipment as required in conventional methods, every circuit is calibrated by simply opening the switch that applies Pulse_IN to the driver and adjusting the Vbias voltage to produce three (3) volts across the laser diode terminals. This works because at this voltage all laser diodes will result in very low currents due to their high off resistance. This calibration can be performed with or without the laser diode connected allowing each circuit to be calibrated when the pcb is tested.

Pre-Charge Method

A pulse command method called 'Pre-Charge' is now described in a non-limiting embodiment, that provides additional margin to guarantee that the first pulse in a burst will always occur and prevent a missing pixel on the display screen. As provided in FIG. 9, it is possible for the first pulse in a burst that occurs after a sustained off period to fail to illuminate a pixel. This potential failure mechanism, however, is greatly improved with the drive method described herein. It is important to note, however, that when a laser diode deviates substantially from a normal condition, a failure to light may still occur. To handle these cases, a 'Pre-Charge' method consisting of commanding a single low amplitude pulse or a burst of normal amplitude pulses can be used to further increase the bias current and charge any capacitance in the laser diode electrical path.

Figure 13:
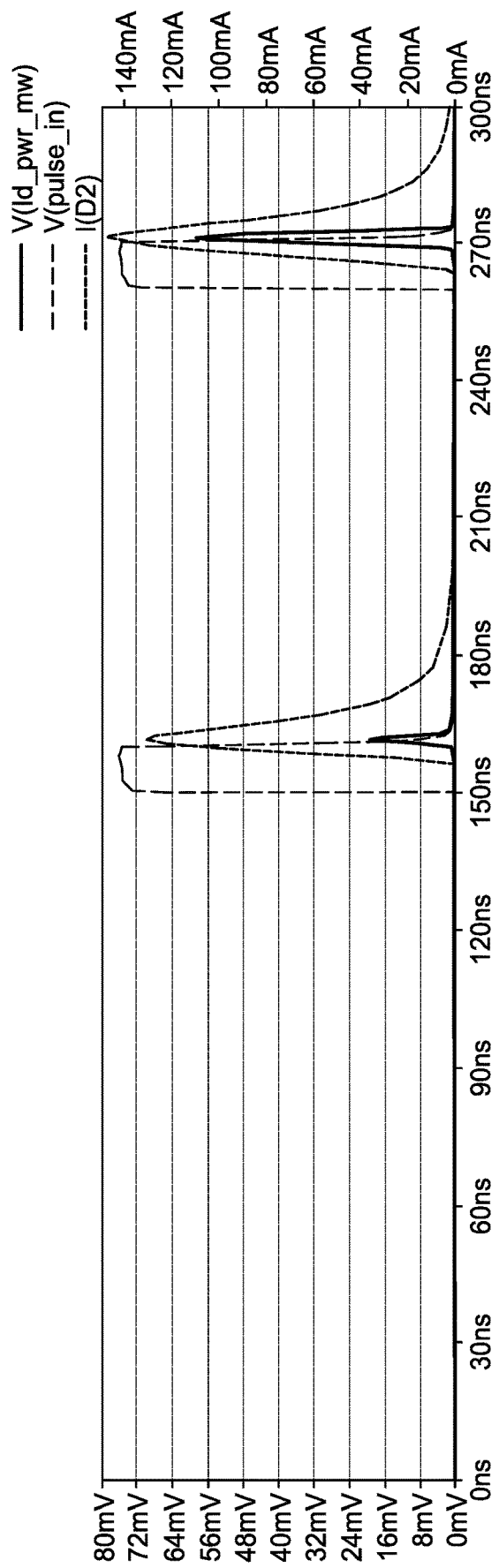
FIG. 13 is a graph of voltage over time with no precharge for a laser diode.

As provided in FIG. 3, a 'Pulse In' is typically from an adjustable voltage source connected through an analog switch. FIG. 13 shows an example case where pre-charge can improve what is defined as the 'first pixel up' after a long period of no pulses. In FIG. 13 the trace 1300 is the 'Pulse In' signal input to the driver. The trace 1302 shows the laser diode current pulses for the first two pixels in a burst. The peak current of the first pulse is slightly lower than the second pulse due to capacitance charging. The resulting laser output power is illustrated in 1304 and it is seen that very good current control is required to result in consistent peak output power.

Figure 14:
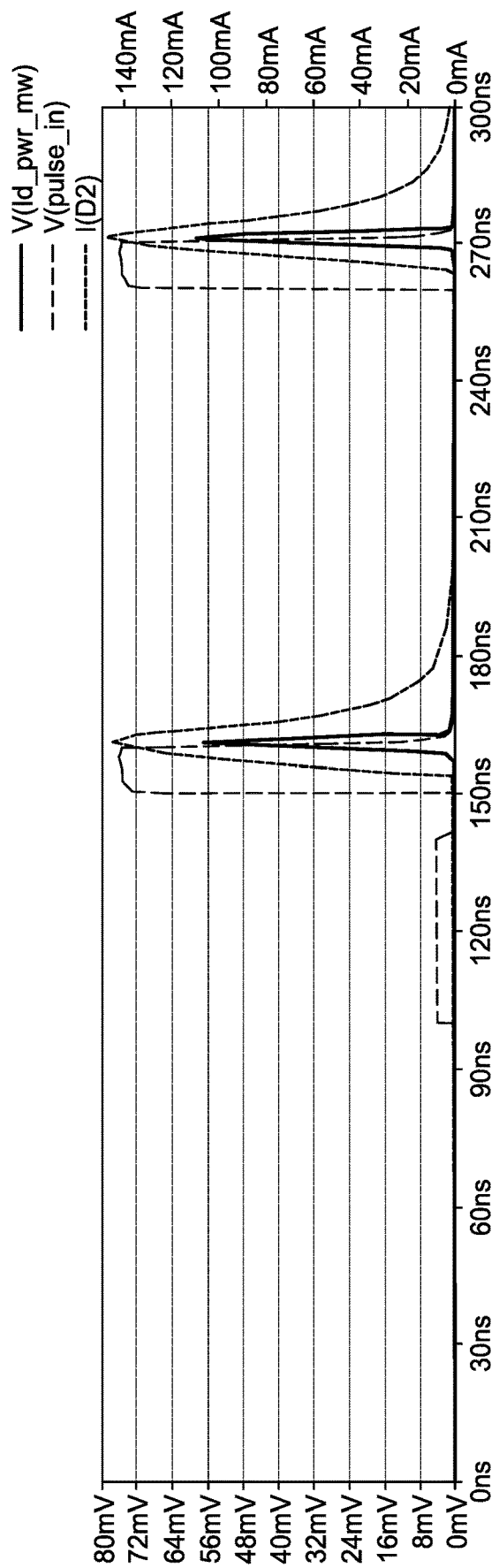
FIG. 14 is a graph of voltage over time for a single low precharge for a laser diode.
Figure 15:
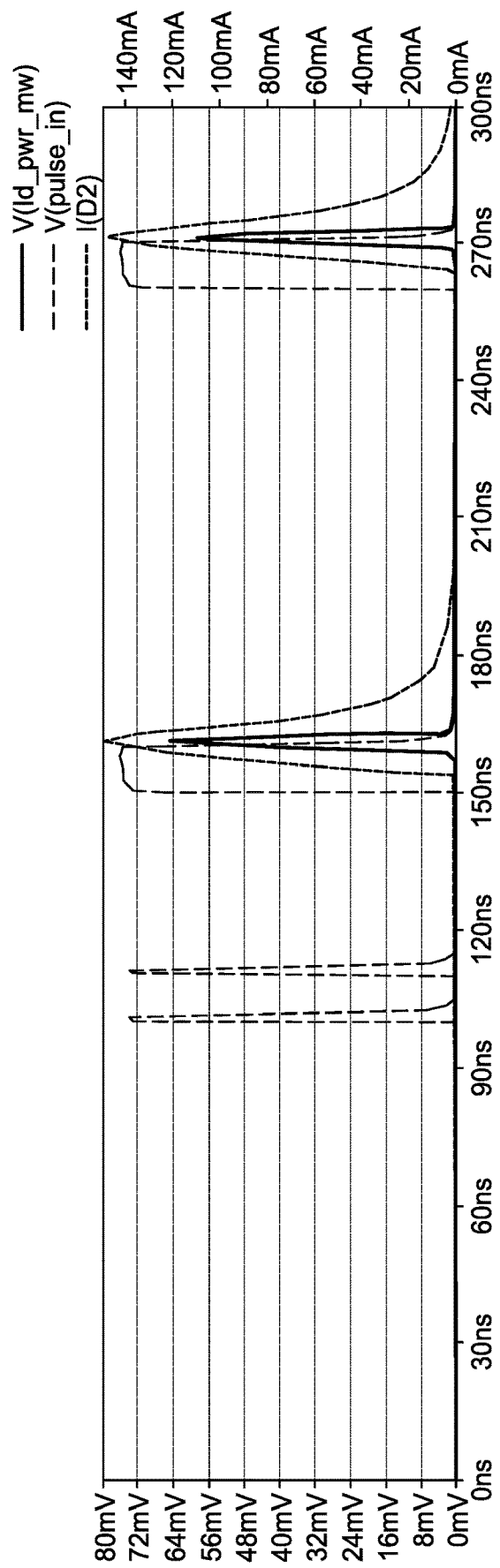
FIG. 15 is a graph of voltage over time for two pre-charge pulses for a laser diode.

FIG. 14 shows a graph that uses a 'pre-charge' of the laser and electrical connection capacitance to produce consistent output optical power levels. In this case, a low amplitude pulse of voltage is applied just prior to the larger pulse used to illuminate the pixel. The low amplitude pulse is typically adjusted to result in a low current pulse that is well below threshold (about 5 to 10 ma) just prior to the high amplitude pulse used to illuminate the pixel. In FIG. 14, the low pre-charge pulse results in the first and second pulses matching in optical output.

A second alternative method for a cost-effective design is to take advantage of the fact that the laser diode current rise and fall times are slower than the 'Pulse In' waveforms. In this case 'Pre-charge' is performed using a pulse control method that switches the 'Pulse In' signal on and off quickly to let the driver low pass filter the pulse train input. By properly modulating the On-Off pre-charge switch timing, we can achieve an average bias current level that matches the first method in performance. This is shown in FIG. 14. The benefits of the embodiment is that it can be implemented using the existing circuits that are already in place.

In one non-limiting embodiment, a method to drive a laser diode, is disclosed comprising increasing a bias current to the laser diode to a threshold level, wherein the threshold level is below an actuation level of the laser diode and wherein a resistor is placed in parallel to the laser diode, charging a capacitance to a precharge capacitance of a circuit including the laser diode, wherein the precharge capacitance is below a capacitance actuation level of the laser diode and actuating the laser diode.

In another non-limiting embodiment, the method may be performed wherein the increasing the bias current to the laser diode is performed by providing a single amplitude pulse of current to the laser diode.

In another non-limiting embodiment, the method may be performed wherein the increasing the bias current to the laser diode is performed by providing a burst of amplitude pulses to the laser pulses.

In another non-limiting embodiment, the method may be performed wherein increasing the bias current to the laser diode is through an adjustable voltage source.

In another non-limiting embodiment, the method may be performed wherein the adjustable voltage source is controlled through an analog switch.

In another non-limiting embodiment, the method may be performed wherein the increasing the bias current to the laser diode to the threshold level is through sweeping a current from a zero level to the threshold level.

In another non-limiting embodiment, a method to drive a laser diode is disclosed comprising increasing a bias current to the laser diode in a series of pulses to a threshold level, wherein the threshold level is below an actuation level of the laser diode and wherein a resistor is placed in parallel to the laser diode and wherein the series of pulses are greater in frequency than a laser diode current discharge rate; charging a capacitance to a precharge capacitance of a circuit including the laser diode, wherein the precharge capacitance is below a capacitance actuation level of the laser diode and actuating the laser diode.

In a further non-limiting embodiment, the method may be performed wherein the increasing the bias current to the laser diode is through an adjustable voltage source.

In a further non-limiting embodiment, the method may be performed wherein the adjustable voltage source is controlled through an analog switch.

In a further non-limiting embodiment, the method may be performed wherein the increasing the bias current to the laser diode to the threshold level is through sweeping a current from a zero level to the threshold level.

In a further non-limiting embodiment, an arrangement for providing a current to an apparatus is disclosed comprising a diode, a resistor placed in parallel to the laser diode, at least two transistors, wherein each transistor has a collector, an emitter and a base, and each collector is connected to the laser diode, at least one operational amplifier connected to each base of the at least two transistors, a direct current power supply connected to the at least one operational amplifier, and at least one direct current power supply connected to each of the emitters of the at least two transistors.

In a further non-limiting embodiment, the arrangement may further comprise at least one capacitor placed in parallel to the at least one operational amplifier.

In a further non-limiting embodiment, the arrangement may be performed wherein the at least two transistors is a first transistor and a second transistor.

In a further non-limiting embodiment, the arrangement may further comprise at least two resistors positioned in between the emitters of the first transistor and the second transistor and the at least one direct current power supply connected to each of the emitters.

In a further non-limiting embodiment, the arrangement may be configured wherein the at least two resistors is a first resistor and a second resistor.

In a further non-limiting embodiment, the arrangement may be configured wherein the first resistor has a higher resistive value than the second resistor.

In a further non-limiting embodiment, the arrangement may further comprise at least one capacitor placed in parallel with one of the at least two resistors positioned in between the emitters of the first transistor and the second transistor.

In a further non-limiting embodiment, the arrangement may further comprise at least one resistor placed between the emitters of the first transistor and the second transistor and ground.

In a further non-limiting embodiment, the arrangement may be configured wherein the diode is a laser diode.

While the foregoing is directed to embodiments of the present disclosure, other and further embodiments of the disclosure may be devised without departing from the basic scope thereof, and the scope thereof is determined by the claims that follow.

What is claimed is:

1. An arrangement, comprising:
a resistor arranged in parallel to a laser diode, wherein the arrangement is configured to receive current at the resistor and reduce current of the laser diode such that the current of the laser diode approaches zero while the current is applied to the resistor, wherein the arrangement is configured such that the current is applied in a pre-charge process, and wherein the pre-charge process comprises applying a first pulse in a burst of pulses, wherein the first pulse in the burst occurs after a sustained off period to fail to illuminate a pixel, and wherein the first pulse illuminates a pixel after the sustained not illuminated off period.

2. The arrangement of claim 1, wherein resistor is configured to receive a current of 15 ma.

3. The arrangement of claim 1, wherein the current configured to be applied to the resistor and to be reapplied after being turned off.

4. The arrangement of claim 1, wherein the pre-charge process comprises using a pulse control method that switches a 'Pulse In' signal on and off to let a laser diode driver low pass filter a pulse train input.

5. The arrangement of claim 1, wherein the pre-charge process comprises an on-off pre-charge switch timing.

6. The arrangement of claim 1, wherein the current is applied from an adjustable voltage source connected through an analog switch, wherein the current is applied as the first pulse and a second pulse, and wherein a peak current of the first pulse is slightly lower than the second pulse due to capacitance charging.

7. The arrangement of claim 1, wherein the arrangement is configured such that the current is applied as a pulse of voltage just prior to a larger pulse used to illuminate a pixel, wherein the pulse is adjusted to result in a pulse that is below a threshold just prior to the larger pulse used to illuminate the pixel, and wherein the threshold is 5 ma to 10 ma.

8. The arrangement of claim 1, wherein the arrangement is configured such that the current is applied through an adjustable voltage source, and wherein the adjustable voltage source is controlled through an analog switch.

9. The arrangement of claim 1, wherein the arrangement is configured such that the resistor is part of a circuit, and wherein the circuit further comprises at least one capacitor placed in parallel to at least one operational amplifier, and wherein the circuit further comprises at least a second resistor.

10. A method, comprising:
applying current to a resistor, wherein the resistor is arranged in parallel with a laser diode, and wherein current of the laser diode will reduce and approach zero while the current is applied to the resistor, wherein the current is applied in a pre-charge process, and wherein the pre-charge process comprises applying a first pulse in a burst of pulses, wherein the first pulse in a burst occurs after a sustained off period where a pixel is not illuminated, and wherein the first pulse illuminates a pixel after the sustained not illuminated off period.

11. The method of claim 10, wherein the current applied is 15 ma.

12. The method of claim 10, wherein the current applied to the resistor is turned off, and wherein the current is reapplied after being turned off.

13. The method of claim 10, wherein the pre-charge process comprises using a pulse control method that switches a 'Pulse In' signal on and off to let a laser diode driver low pass filter a pulse train input.

14. The method of claim 10, wherein the pre-charge process comprises an on-off pre-charge switch timing.

15. The method of claim 10, wherein the current is applied from an adjustable voltage source connected through an analog switch, wherein the current is applied as the first pulse and a second pulse, and wherein a peak current of the first pulse is slightly lower than the second pulse due to capacitance charging.

16. The method of claim 10, wherein the current is applied as a pulse of voltage is applied just prior to a larger pulse used to illuminate a pixel, wherein the pulse is adjusted to result in a pulse that is below a threshold just prior to the larger pulse used to illuminate the pixel, and wherein the threshold is 5 ma to 10 ma.

17. The method of claim 10, wherein the current is applied through an adjustable voltage source, and wherein the adjustable voltage source is controlled through an analog switch.

18. The method of claim 10, wherein the resistor is part of a circuit, and wherein the circuit further comprises at least one capacitor placed in parallel to at least one operational amplifier, and wherein the circuit further comprises at least a second resistor.

* * * * *